United States Patent [19]

Knuth et al.

[11] 4,142,286
[45] Mar. 6, 1979

[54] APPARATUS AND METHOD FOR INSERTING SOLDER PREFORMS ON SELECTED CIRCUIT BOARD BACK PLANE PINS

[75] Inventors: Kenneth V. Knuth, Malvern; John H. Drinkard, Jr., Exton, both of Pa.

[73] Assignee: Burroughs Corporation, Detroit, Mich.

[21] Appl. No.: 886,763

[22] Filed: Mar. 15, 1978

[51] Int. Cl.² ............................................. H05K 3/30
[52] U.S. Cl. ....................................... 29/626; 29/628; 29/739; 29/757; 29/759
[58] Field of Search ................. 29/628, 626, 739, 757, 29/821, 759; 228/246

[56] References Cited

U.S. PATENT DOCUMENTS

| | | | |
|---|---|---|---|
| 3,286,671 | 11/1966 | Fuller | 29/628 X |
| 3,414,962 | 12/1968 | Altamura | 29/821 X |
| 3,468,024 | 9/1969 | Yonkers | 29/821 X |
| 3,667,103 | 6/1972 | Petree | 29/743 X |
| 3,736,651 | 6/1973 | Law et al. | 29/739 X |
| 3,744,129 | 7/1973 | Dewey, Jr. | 29/628 X |
| 3,785,035 | 1/1974 | Busler et al. | 29/739 |
| 3,808,681 | 5/1974 | Law et al. | 29/628 |
| 3,924,325 | 12/1975 | Kufner | 29/739 X |
| 3,932,934 | 1/1976 | Lynch et al. | 29/628 |
| 4,089,105 | 5/1978 | Yeo et al. | 29/626 |

*Primary Examiner*—C.W. Lanham
*Assistant Examiner*—C. J. Arbes
*Attorney, Agent, or Firm*—Mark T. Starr; Edmund M. Chung; Kevin R. Peterson

[57] ABSTRACT

An apparatus and method for inserting solder preforms on selected circuit board back plane pins. A template, drilled with a pattern of holes corresponding to the pattern of back plane pins and counterbored in hole positions corresponding to back plane pins which are to receive solder preforms, is positioned at an acute angle and vibrated at low frequency. Solder preforms are placed at the upper end of the template and due to the vibration and angle the template is positioned at, slide down the surface of the template and are trapped in the counterbored holes. The preform loaded side of the template is aligned with the circuit board back plane and the two are clamped together, causing the selected back plane pins to pass through the corresponding solder preforms positioned in the template's counterbored holes. The clamping circuit board and template are rotated so the template is positioned above the circuit board. The template is then removed, leaving the selected circuit board back plane pins with solder preforms inserted on them.

17 Claims, 8 Drawing Figures

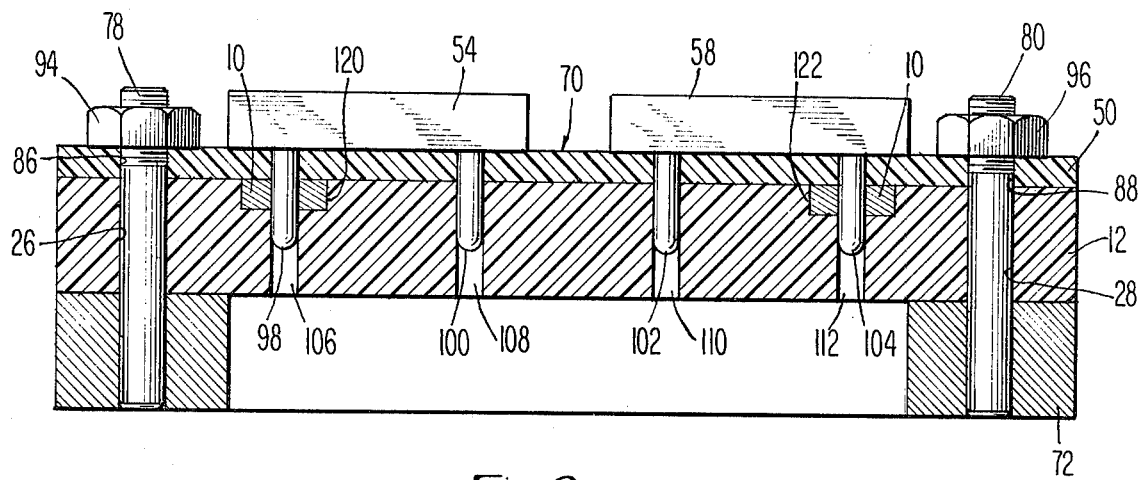
_Fig.6_
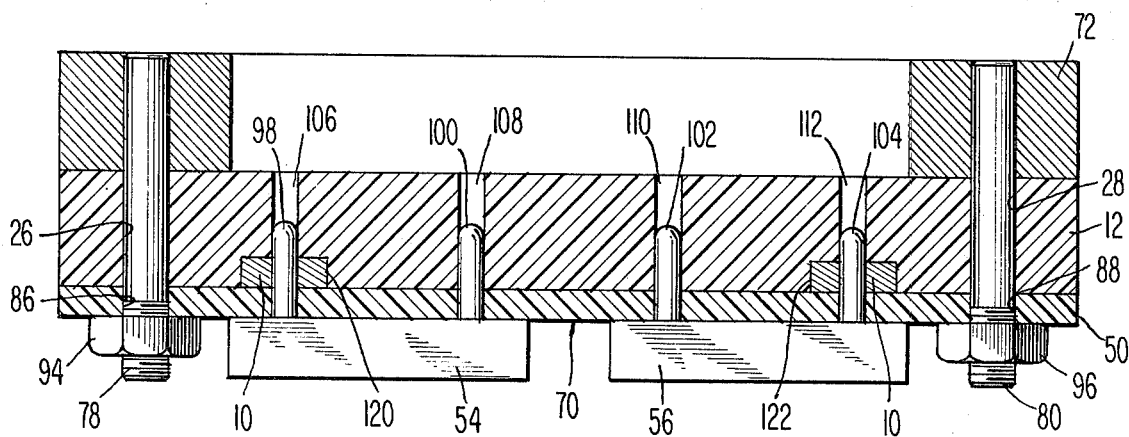
_Fig.7_
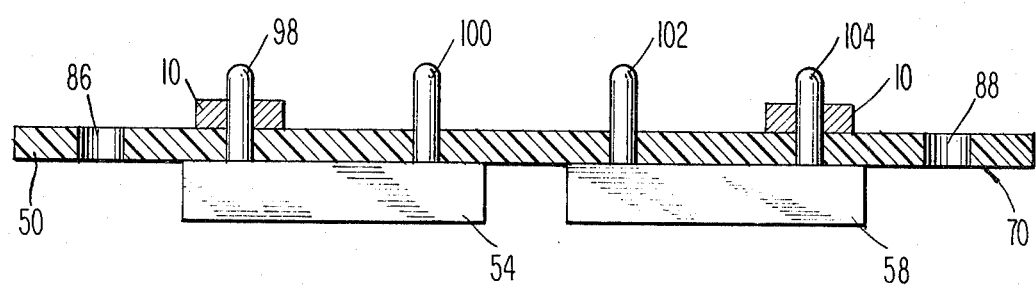
_Fig.8_

APPARATUS AND METHOD FOR INSERTING SOLDER PREFORMS ON SELECTED CIRCUIT BOARD BACK PLANE PINS

BACKGROUND OF THE INVENTION

This invention relates in general to an apparatus and method for inserting solder preforms on selected circuit board back plane pins.

Circuit boards utilized in electronic products often incorporate pins which pass perpendicularly through the circuit board in order to provide electrical connections to voltage and ground planes printed on the surfaces of the circuit board. In some environment, these pins are a part of a component or connector. In such case, the circuit board is drilled with a pattern of holes corresponding to the pattern of pins coming out of the component or connector and the component or connector is mounted on the circuit board with its pins passing through the corresponding holes in the circuit board. When it is desired to electrically connect a subset of these pins to the printed voltage and ground planes of the circuit board they pass through, preformed donut shaped pieces of solder are often utilized. After the component is mounted on one side of the circuit board, solder preforms are inserted on those pins extending perpendicularly through the other side of the circuit board to which an electrical connection between the pin and the voltage or ground plane is desired. The solder preforms are only inserted on those pins which require electrical connection to the circuit board's voltage or ground plane.

After the solder preforms have been inserted, the entire circuit board is put in an oven. The heat generated by the oven melts the solder preforms and the solder flows between the pins containing solder preforms and the corresponding hole in the circuit board, creating an electrical connection between the pins and the circuit board's printed ground or voltage plane.

In the prior art, various methods and apparatuses have been utilized to insert solder preforms on selected circuit board back plane pins. Originally, tweezers were utilized by an operator to position a solder preform on each selected pin. An advance over this method is the use of a gun which inserts a solder preform on a pin after an operator positions the tip of the gun over the pin. The gun may be used in conjunction with a pattern which indicates to the operator which pins are to have solder preforms inserted on them. The major disadvantages of these and other prior art methods and apparatuses is that they are time consuming, requiring an operator to perform many repeated insertion operations. In addition, the prior art methods may result in operator errors as the operator often fails to follow the instructions or pattern specifying which pins are to have solder preforms inserted on them. A further drawback of the insertion gun of the prior art is that the solder preforms, due to their flux coating, often stick to the inside of the gun's dispenser tube.

It is a general object of the present invention to eliminate these and other drawbacks of the prior art by providing an improved apparatus and method for inserting solder preforms on selected circuit board back plane pins.

It is a further object of the present invention to provide an apparatus and method which speeds up the process of inserting solder preforms on a selected subset of a circuit board's back plane pins.

It is another object of the present invention to provide an apparatus and method for inserting solder preforms on selected back plane pins that is particularly well adapted to inserting the same pattern of solder preforms on the back plane pins of a large number of circuit boards.

It is still another object of the present invention to provide an apparatus and method for inserting solder preforms on selected circuit board back plane pins which minimizes errors caused by an operator inserting a solder preform on a pin not requiring one or failing to insert a solder preform on a pin which does require one.

These and other objects, features and advantages of the present invention will become more apparent from the detailed description of the preferred embodiment when read in conjunction with the drawings.

SUMMARY OF THE INVENTION

According to the invention, a template is provided which is drilled with a pattern of holes corresponding to the pattern of back plane pins so that when the template and back plane are horizontally aligned each back plane pin will pass through a corresponding hole in the template. Hole positions on the template corresponding to the subset of back plane pins which are to receive solder preforms are counterbored to a diameter and depth to accomodate a solder preform.

The template, counterbored side up, is positioned in a frame which is attached to a horizontal support by a plurality of vertically positioned springs. The length of the springs is chosen to position the horizontal plane of the template at an acute angle with the horizontal support. A vibration motor attached to the frame applies low frequency vibrations which serve to vibrate the template. Solder preforms are placed on the upper end of the template and due to the vibration of the template the preforms slide down the counterbored surface of the template. As the preforms slide down the surface of the template, they fall into the counterbored holes, at the same time passing over the template holes which are not counterbored and the counterbored holes which have already been filled with preforms. Additional preforms are placed on the top of the template until each counterbored hole has been filled with a preform.

After every counterbored hole on the template has been filled with a solder preform, the template is removed from the frame and installed in an alignment frame which positions the preform loaded template horizontally, counterbored side up. The circuit board, back plane side down, is then positioned in the alignment frame above the template. This assures that the circuit board back plane pins are perpendicularly aligned with the corresponding holes of the template. The alignment frame locking mechanism is then engaged, sandwiching the template between the circuit board and the alignment frame and causing each pin of the circuit board back plane to first pass through a solder preform, if the corresponding template position is loaded with a preform and then causing each back plane pin to pass through the corresponding hole in the template.

The alignment frame is next rotated 180 degrees so that the circuit board back plane, pin side up, is now below the template. The locking mechanism clamping the template between the circuit board and alignment frame is then released and the circuit board is removed from the alignment frame.

At this point solder preforms have been inserted on all selected back plane pins and the circuit board is ready for insertion in an oven where the solder preforms will be melted to create the desired electrical contacts.

DESCRIPTION OF THE DRAWINGS

FIG. 6 is a cross section of FIG. 5 taken along the lines 6—6.

FIG. 7 is a cross section of FIG. 5 taken along the lines 6—6 after the alignment frame has been rotated 180 degrees.

FIG. 8 illustrates a cross section through a circuit board assembly after solder preforms have been inserted on selected circuit board back plane pins.

DETAILED DESCRIPTION OF THE PREFERRED EMBODIMENT

Figure 1:
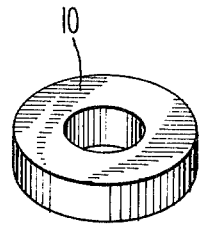
FIG. 1 is a pictorial illustration of a typical solder preform as used in the present invention.
Figure 4:
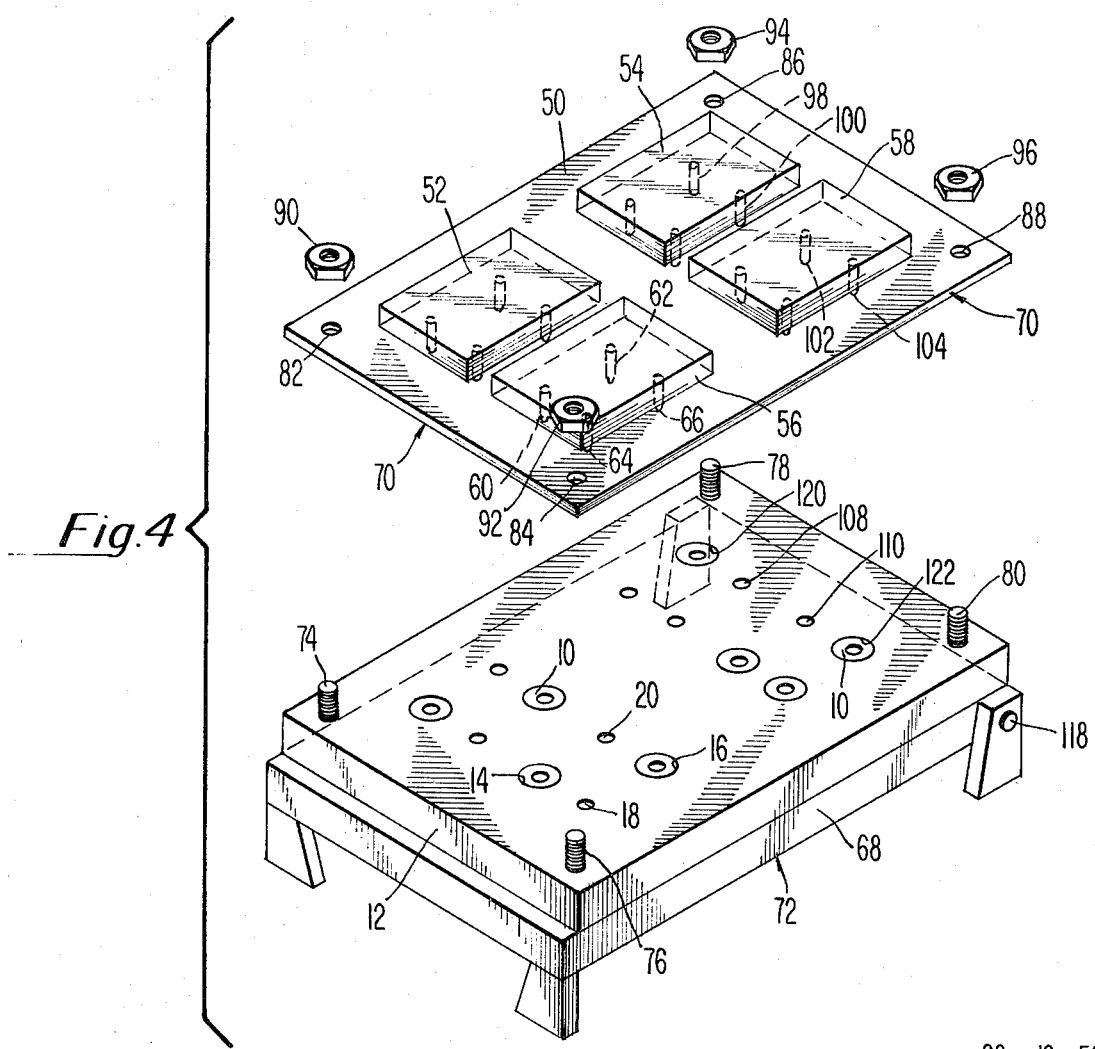
FIG. 4 illustrates the alignment frame used to insert solder preforms on selected circuit board back plane pins.

Referring now to FIG. 1, there is shown a pictorial view of a solder preform 10 such as that typically used to make connections between circuit board back plane pins and the circuit board's printed voltage and ground planes. Referring to FIG. 4, a typical circuit board 50 is shown. In the preferred embodiment of the present invention, the circuit board 50 is of the two sided copper clad type, including external voltage and ground planes, one of the two planes being printed on each of the circuit board's two surfaces. In the preferred embodiment, connectors 52, 54, 56 and 58 are attached to the circuit board 50 by each of the connector's 52, 54, 56 and 58 four input pins. Thus, pins 60–66 of connector 56 pass through four corresponding holes drilled in circuit board 50 when the connector 56 is attached to the circuit board 50. The holes drilled in the circuit board 50 to accommodate the connector pins 60, 62, 64 and 66 are slightly larger than the diameter of the pins 60, 62, 64 and 66 in order to allow solder to flow and make an electrical connection between the pins 60, 62, 64 and 66 and the printed voltage and ground planes of the circuit board 50.

In order to make an electrical connection between a connector pin 60, 62, 64 and 66 and the printed voltage or ground plane of the circuit board 50, the circuit board assembly 70 is turned connector side down and solder preforms 10 are placed onto those pins 60, 62, 64 and 66 to which an electrical connection with the circuit board's 50 printed ground or voltage plane is to be made. If no connection is desired between a pin 60, 62, 64 and 66 and either of the circuit board's 50 printed ground or voltage planes, a solder preform 10 is not installed on the pin. After the solder preforms 10 to make the desired connections have been inserted on the pins 60, 62, 64 and 66, the circuit board assembly 70 is inserted in an oven, the heat of which causes the solder preforms 10 to melt. The melted solder preforms 10 flow into the space between the pins 60, 62, 64 and 66 and the corresponding inner surfaces of the circuit board holes through which the pins 60, 62, 64 and 66 pass, creating an electrical connection between the pins 60, 62, 64 and 66 and the printed ground or voltage planes of the circuit board 50. In the preferred embodiment, the pattern of the printed voltage and ground planes is such that the conductive material is printed on both surfaces of the circuit board 50 at points adjacent to the hole corresponding to each selected pin. However, since each selected pin is to be electrically connected to only one of the two printed planes, the printed pattern adjacent to the hole does not extend to make contact with the printed pattern adjacent to another hole unless the pins to be inserted in both holes are to be electrically connected to the same printed plane. In other words, although the conductive material is printed on both circuit board surfaces, at points adjacent to a hole corresponding to a selected pin, the conductive material on only one of the two circuit board surfaces adjacent to the selected pin is connected to the printed pattern on the corresponding surface. Hence, each pin is electrically connected to only one of the two planes.

Figure 2:
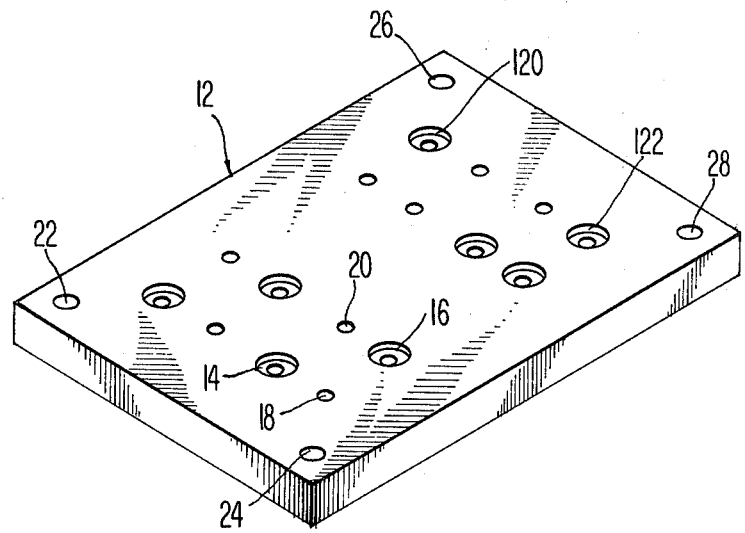
FIG. 2 illustrates the template used to specify the circuit board back plane pins on which solder preforms will be inserted.

The apparatus and method of the subject invention provides an improvement to prior art techniques of inserting solder preforms 10 on selected circuit board back plane pins 60, 62, 64 and 66. Referring to FIG. 2, an epoxy glass template 12, as used in the preferred embodiment of the present invention, is illustrated. The template 12 is drilled with a pattern of sixteen holes layed out to correspond to the pattern of sixteen pins created by mounting connectors 52, 54, 56 and 58 on circuit board 50. The holes drilled in the template 12 are of a diameter at least equal to the diameter of the connector pins so that the circuit board assembly 70 may be mounted on top of the template 12 with the connector pins extending from the bottom of the circuit board assembly 70 and passing through the corresponding holes in the template 12.

Holes in the template 12 corresponding to circuit board assembly back plane pins which are to receive a solder preform 10 are counterbored to a diameter and depth equal to or greater than the corresponding dimensions of the solder preforms 10. Thus, back plane pins 60 and 66 of circuit board assembly 70 and to receive solder preforms 10 since the corresponding holes 14, 16 in template 12 are counterbored. To the contrary, back plane pins 62 and 64 of circuit board assembly 70 will not receive solder preforms 10 since the corresponding holes 18 and 20 in template 12 are not counterbored. The significance of the presence of a counterbored hole in template 12 will be more apparent from the discussion which follows.

Figure 3:
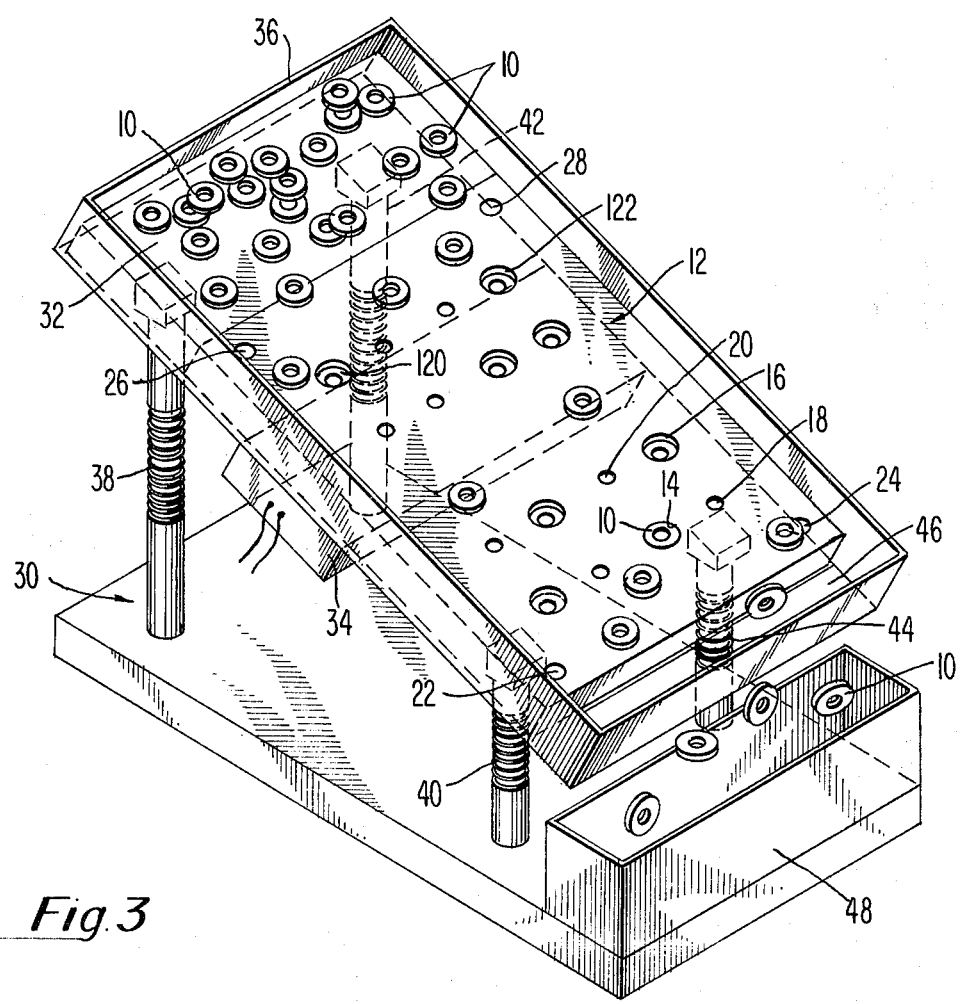
FIG. 3 illustrates the mechanism used to load solder preforms into the counterbored holes of the template of FIG. 2.

Referring now to FIG. 3, the template 12 is installed, counterbore side up, in preform loader 30, which in the preferred embodiment of the present invention positions the horizontal plane of the template 12 at a 35 degree angle. A quantity of solder preforms 10 are then loaded onto guide ramp 32 and vibration motor 34 is activated. The vibration motor 34 applies low frequency vibrations to frame 36 within which the template 12 is nested. The springs 38, 40, 42 and 44 serve to float the frame 36 so that the vibrations applied to the frame 36 are not damped.

The vibrations applied to the frame 36 causes solder preforms 10 to slowly slide down the surface of guide ramp 32 and onto the counterbored surface to template 12. As a solder preform 10 passes over a counterbored hole in template 12, it falls into and is trapped in the counterbored hole, as in the case of counterbored template hole 14. The solder preforms 10 pass over the non-counterbored template holes and those counterbored holes already containing a preform 10, and continue sliding down the template 12 surface. Solder preforms 10 reaching the lower end of the template 12 without being trapped in a counterbored hole fall through the opening 46 at the lower end of frame 36 and are collected in box 48.

Additional solder preforms 10 are loaded onto guide ramp 32 until all counterbored holes in template 12 contain a solder preform 10. When this condition occurs, the remaining solder preforms 10 which have not fallen into counterbored holes are allowed to continue to slide down the surface of the template 12 until they are all collected in box 48. At this time, the preform loaded template 12 is removed from preform loader 30.

Referring now to FIG. 4, the template alignment holes 22, 24, 26 and 28 (FIG. 2) are used to position the preform loaded template 12, counterbore side up, on the corresponding alignment pins 74, 76, 78 and 80 of alignment frame 72. Next, the circuit board assembly 70, pin side down, is installed above the template 12 by utilizing alignment holes 82, 84, 86 and 88 and the corresponding alignment pins 74, 76, 78 and 80 to guide it into position.

Figure 5:
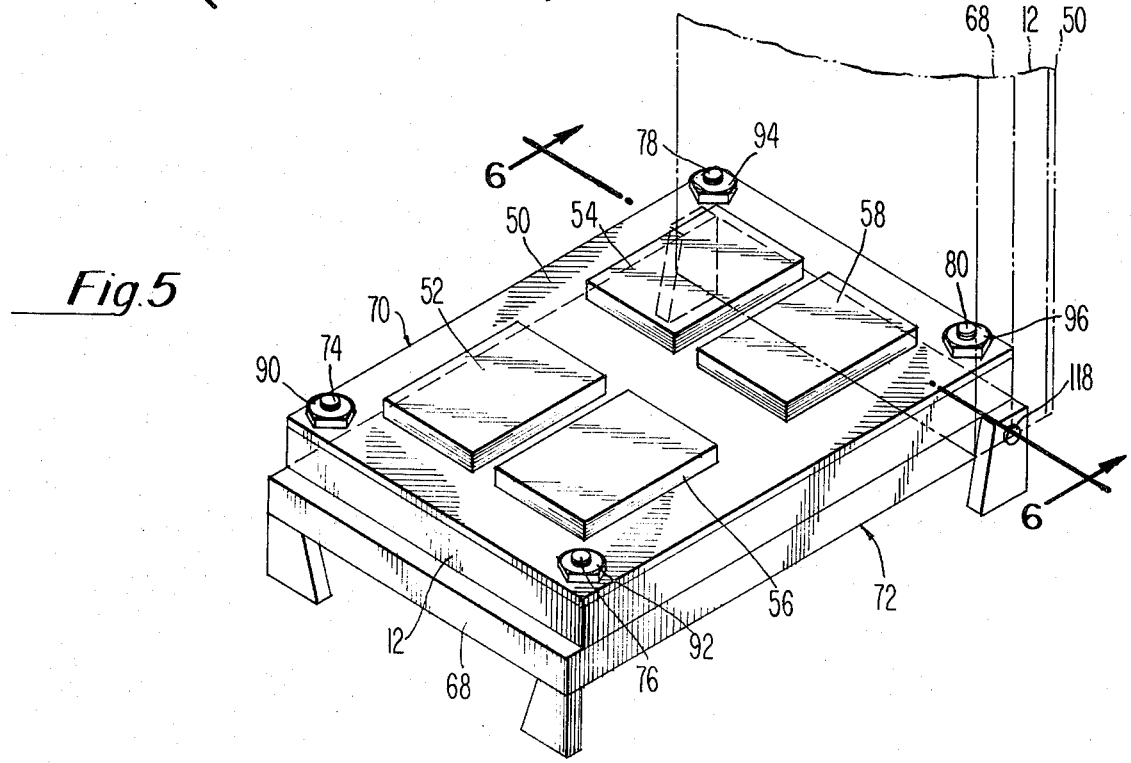
FIG. 5 illustrates the template of FIG. 2 and the circuit board assembly positioned in the alignment frame.

As shown in FIG. 5, the circuit board assembly 70 and template 12 are next locked in position against the top 68 of alignment frame 72 utilizing locking bolts 90, 92, 94 and 96. The locking of the circuit board assembly 70 against the template 12 serves two purposes, which can best be appreciated by referring to FIG. 6, which is a cross section through FIG. 5 taken along the lines 6—6. As locking bolts 90, 92, 94 and 96 are tightened, circuit board assembly pins 98 and 104 are guided through the center of solder preforms 10 while pins 100 and 102 are guided into their corresponding non-counterbored template holes 108 and 110. This serves to insert the solder preforms 10 on the desired pins 98 and 104. The effect of clamping the lower surface of circuit board assembly 70 against the counterbored surface of template 12 also prevents the solder preforms 10 from falling off their pins 98 and 104, the importance of which will become obvious from the following discussion.

Referring again to FIG. 5, after the template 12 and circuit board assembly 70 have been locked in position on the alignment frame 72, the top 68 of the alignment frame 72 is rotated 180 degrees by pivoting it around pivot pin 118. During the rotation, the solder preforms 10 are held on their respective pins due to the template 12 and circuit board assembly 70 being clamped together.

After the top 68 of the alignment frame 72 has been rotated 180 degrees, the template 12 and circuit board assembly 70 are positioned as shown in FIG. 7, which is a cross section through FIG. 5 along the lines 6—6. Note that the solder preforms 10 have now been inserted on the circuit assembly back plane pins 98 and 104 corresponding to counterbored hole positions 120 and 122 in template 12. Locking bolts 90—96 are not unlocked and the circuit assembly is removed from the alignmemt frame 72. It will be obvious to those skilled in the art that variations on the locking bolts 90, 92, 94 and 96 may be used to clamp the circuit board assembly 70 and template 12 against the top of alignment frame 72. For example, alignment pins 74, 76, 78 and 80 may have holes drilled perpendicularly through their axis to accommodate locking pins to secure the circuit board assembly 70 and template 12 against the top of alignment frame 72.

As shown in FIG. 8, which is a cross section though the circuit board assembly 70 taken along the lines 6—6, solder preforms 10 have been inserted on selected circuit board back plane pins 98 and 104 corresponding to counterbored template 12 holes 120 and 122. The circuit board assembly 70 is now ready for insertion in an oven where the heat will melt the solder preforms 10 and create the desired electrical connections between pins 98, 104 and the circuit board's 50 printed ground or voltage plane.

Having shown and described a preferred embodiment of the invention, those skilled in the art will realize that various omissions, substitutions and changes in forms and details of the apparatus and method illustrated and its operation may be made without departing from the spirit of the invention. For example, circuit board's including an internal voltage or ground plane, rather than planes printed on the circuit board's surfaces, could be accommodated. It is the intention, therefore, to be limited only as indicated by the scope of the following claims.

What is claimed is:

1. A method of inserting solder preforms on selected back plane pins of a circuit board, which comprises the steps of:
    providing a template, wherein said template is drilled with a pattern of holes corresponding to the pattern of circuit board back plane pins, the diameter of said holes being at least equal to the diameter of the corresponding circuit board back plane pins, one surface of said template being counterbored at the hole positions corresponding to said selected back plane pins, the diameter and depth of said counterbores being at least equal to the diameter and depth of said solder preforms, respectively;
    inserting said solder preforms in all counterbored holes in the surface of said template;
    aligning said circuit board back plane above said template with said back plain pins perpendicular to and above the corresponding holes in said template;
    moving said circuit board back plane toward and into contact with said template, whereby the pins of said circuit board back plane pass through the corresponding holes in said template after the selected back plane pins pass through the corresponding solder preforms;
    clamping said board against said template;
    rotating said clamped circuit board and template to position said template above said circuit board;
    unclamping said circuit board from said template; and removing said template.

2. A method of inserting solder preforms on selected back plane pins of a circuit board as defined in claim 1, wherein the step of inserting said solder preforms in all counterbored holes in the surface of said template comprises;
    positioning said template with its horizontal plane at an acute angle with respect to an horizontal plane, counterbored side up;
    distributing solder preforms on the elevated end of the counterbored surface of said template; and vibrating said template, whereby said solder preforms slide down the counterbored surface of said template and fall into said counterbored holes.

3. A method of inserting solder preforms on selected back plane pins of a circuit board as defined in claim 2, wherein the step of inserting said solder preforms in all counterbored holes in the surface of said template further comprises the step of collecting the solder preforms which slide off the lower end of the counterbored surface of said template.

4. A method as defined by claim 1, wherein said step of inserting said solder preforms in all counterbored holes in the surface of said template is carried out with means comprising:
   a horizontal support;
   a frame for holding said template counterbored surface up;
   means connected between said horizontal support and said frame for holding said frame at an acute angle with respect to said horizontal support and further for vibrationally isolating said frame from said horizontal support; and
   means for vibrating said frame.

5. A method as defined by claim 4, wherein said means for connecting said frame and said horizontal support includes at least one spring.

6. A method as defined by claim 4, wherein said vibrating means comprises a vibrating motor.

7. An apparatus for inserting solder preforms on selected back plane pins of a circuit board, comprising:
   a template drilled with a pattern of holes corresponding to the pattern of circuit board back plane pins, said template further being counterbored to receive said solder preforms at said hole positions corresponding to said selected back plane pins;
   means for inserting one of said solder preforms in each of said template counterbored hole positions;
   means for aligning said circuit board back plane above the counterbored surface of said template with said back plane pins perpendicular to and above the corresponding holes in said template;
   means for moving said circuit board toward and into contact with said template, whereby the pins of said circuit board pass through the corresponding holes in said template, said selected pins first passing through the corresponding solder preforms inserted in said template;
   means for clamping said circuit board against said template;
   means for rotating said circuit board and said template to position said template above said circuit board; and
   means for removing said template from said circuit board.

8. The apparatus of claim 7, wherein the diameter of the counterbore is at least equal to the diameter of said solder preforms.

9. The apparatus of claim 7, wherein the depth of the counterbore is at least equal to the depth of said solder preforms.

10. The apparatus of claim 7, wherein the diameter of the holes drilled in said template is at least equal to the diameter of the corresponding circuit board back plane pins.

11. The apparatus of claim 7 wherein said solder preform insertion means comprises:
   a horizontal support;
   a frame for holding said template, counterbored surface up;
   means connected between said frame and said horizontal support for holding said frame at an acute angle with respect to said horizontal support and further for vibrationally isolating said frame from said horizontal support; and
   means for vibrating said frame.

12. The apparatus of claim 11 wherein said vibration means is connected to said frame.

13. The apparatus of claim 11 wherein said vibration means is a vibrating motor.

14. The apparatus of claim 11 wherein said means connecting said frame and said horizontal support includes at least one spring.

15. The apparatus of claim 11 wherein said frame further includes means, horizontally contiguous with the counterbored surface of said template and adjacent to the raised end of said template for receiving said solder preforms.

16. The apparatus of claim 11 wherein said frame further includes means adjacent to the lower end of said template for collecting the solder preforms which slide off the lower end of said template.

17. The apparatus of claim 11 wherein said frame further includes means for preventing said solder preforms from falling off the sides of said template.

* * * * *